United States Patent [19]

Tan

[11] Patent Number: 6,011,504
[45] Date of Patent: Jan. 4, 2000

[54] METHOD FOR BUILDING A LOW COST, LARGE SCALE, PORTABLE EMI SHIELDED ENCLOSURE

[75] Inventor: Hong Soon Tan, Singapore, Singapore

[73] Assignee: Singapore Technologies Aerospace, Ltd., Singapore, Singapore

[21] Appl. No.: 09/298,497

[22] Filed: Apr. 23, 1999

[51] Int. Cl.$^7$ .............................. H01Q 17/00; H05K 9/00
[52] U.S. Cl. .................................. 342/4; 342/1; 174/35 R
[58] Field of Search ........................... 342/1, 4; 174/35 R

[56] References Cited

U.S. PATENT DOCUMENTS

| | | | |
|---|---|---|---|
| 3,955,199 | 5/1976 | Hutzelman et al. | 343/17.7 |
| 5,134,405 | 7/1992 | Ishihara et al. | 342/1 |
| 5,401,901 | 3/1995 | Gerry et al. | 174/35 R |
| 5,534,873 | 7/1996 | Weichman et al. | 342/165 |

OTHER PUBLICATIONS

PCT/US93/00914, WO 93/15293, Aug. 5, 1993 to Paes, Ned 2., et al., Bulwark Electromagnetic Material Applications Inc. (BEMA) [US/US].

Primary Examiner—Ian J. Lobo
Attorney, Agent, or Firm—George O. Saile; Stephen B. Ackerman

[57] ABSTRACT

A portable enclosure for electromagnetic compatibility (EMC) testing, comprising, a flexible and vacuous arrangement that forms into an inflated arcuate framework having arched ceiling and side supports. The arcuate framework embodies a plurality of vertical arcuate structural members that are separated from one another and held in place by a multiplicity of vacuous and inflatable horizontal support members attached and pneumatically communicative to the vertical arcuate shaped members. After the flexible and vacuous structure is inflated, the arcuate framework is secured to the ground by means of guy-storms that are attached to each side of the plurality of vertical arcuate structural members. A flexible and conductive, two layered main shroud for covering the arched ceiling and side support areas that are defined by the inflated arcuate framework. A similar constructed two layered first and a second end capping shroud for covering, respectfully, front and rear openings of the arcuate framework. A three layered floor shroud covers a floor area defined under the inflated arcuate framework, and service means provided to perform EMC testing.

50 Claims, 5 Drawing Sheets

METHOD FOR BUILDING A LOW COST, LARGE SCALE, PORTABLE EMI SHIELDED ENCLOSURE

BACKGROUND OF THE INVENTION (1) Technical Field

This invention relates generally to electromagnetic compatibility (EMC) and more specifically to the construction of a low cost, portable, inflatable and modular enclosure designed to shield against electromagnetic interference (EMI) while conducting EMC/EMI testing.

(2) Description of the Prior Art

The following four documents relate to a method of and apparatus for an electromagnetically anechoic chamber and shield structure.

U.S. Pat. No. 3,955,199 issued May 4, 1976 to Robert W. Hutzelman and Everitt E. Fairbanks describes a method of and apparatus for ground testing doppler navigation sets. The device is an improved doppler microwave radar simulator which simulates a moving earth, without moving components, so as to minimize weight, complexity and size.

U.S. Pat. No. 5,134,405 issued Jul. 28, 1992 to Katsuo Ishihara, Katano and Yoshio Tomiyama, Kawanishi shows a design for a small-sized (7 m×3 m×2.5 m in height) electromagnetically anechoic chamber for EMC (Electromagnetic Compatibility) tests of electronic devices.

U.S. Pat. No. 5,534,873 issued Jul. 9, 1996 to Alan R. Wcichman, Barton G. Ferrell et al. describes a method for determining the far field radar signature of relatively large and complex objects such as fighter aircraft.

PCT/US93/00914, WO 93/15293, issued Aug. 5, 1993 to Paes, Ned Z.; Phillips, Terry; Thomas, Robert E.; and Aldridge, Joseph, H., Bulwark Electromagnetic Material Applications Inc. (BEMA) [US/US] describes a structurally self-contained RF-shielded enclosure which is rapidly deployable due to its ultra light weight and case of assembly.

Generally, components and assemblies containing electrical devices are subject to EMC tests by their manufacturer. Two conventional techniques used for EMC testing are accomplished in an open-field test site and in electromagnetic anechoic enclosures. The open-field test site is usually done in open air away from populated areas where energy levels of noises are high. Briefly, the arrangement of an open-field test site includes a platform to support a device to be tested, a post for mounting an antenna which is provided at a distant position from the platform in a manner to slide up and down on the post and a measuring instrument which is connected by an electric cable to the antenna. In making noise assessment of radiating electromagnetic waves, the wave emanating from the electrical assembly is measured with the antenna that receives the radiated wave to determine whether the data is below a specified point. When making test irradiation in a strong electric field, a strong electric field is irradiated from the antenna to the device to be tested, and the device to be tested is measured to detect its abnormal state. A conventional anechoic enclosure is surrounded by iron sheets to shield against electromagnetic waves in the radio frequency range. The interior walls and ceiling are lined with microwave absorbent materials. EMC tests can also be made in an anechoic enclosure using the same type of testing apparatus as described for the open-space test site.

When dealing with large assemblies such a military vehicles, aircraft, etc., each of the electrical devices contained within these large assemblies is subject to EMC testing. The amount of testing is enormous in terms of scheduled hours and manpower. Open-air testing is an option for large assemblies. By definition, an open-field test site for EMC testing is a noiseless field. Testing cannot be done in municipalities where electromagnetic noise levels are notably high. If an open-field testing method is used, it must be done in remote areas; however, this is also difficult as data is usually masked by high power transmitters. Open-field testing is also time-consuming since reliable test results are dependent on the stability of localized atmospheric conditions, i.e., temperature and humidity. Testing cannot be done in rain, snow or strong winds.

To overcome these difficulties, tests must be conducted in a large anechoic or shielded chamber, a costly option. Besides the high cost of such structures, such a facility requires a permanent shelter and storage area. The alternative is to devise a means of building a shield facility large enough to accommodate an aircraft but with materials and construction techniques that will render the structure low cost, easy and fast to assemble and dissemble (under one hour), portable, semi-permanent and effective.

Figure 1:
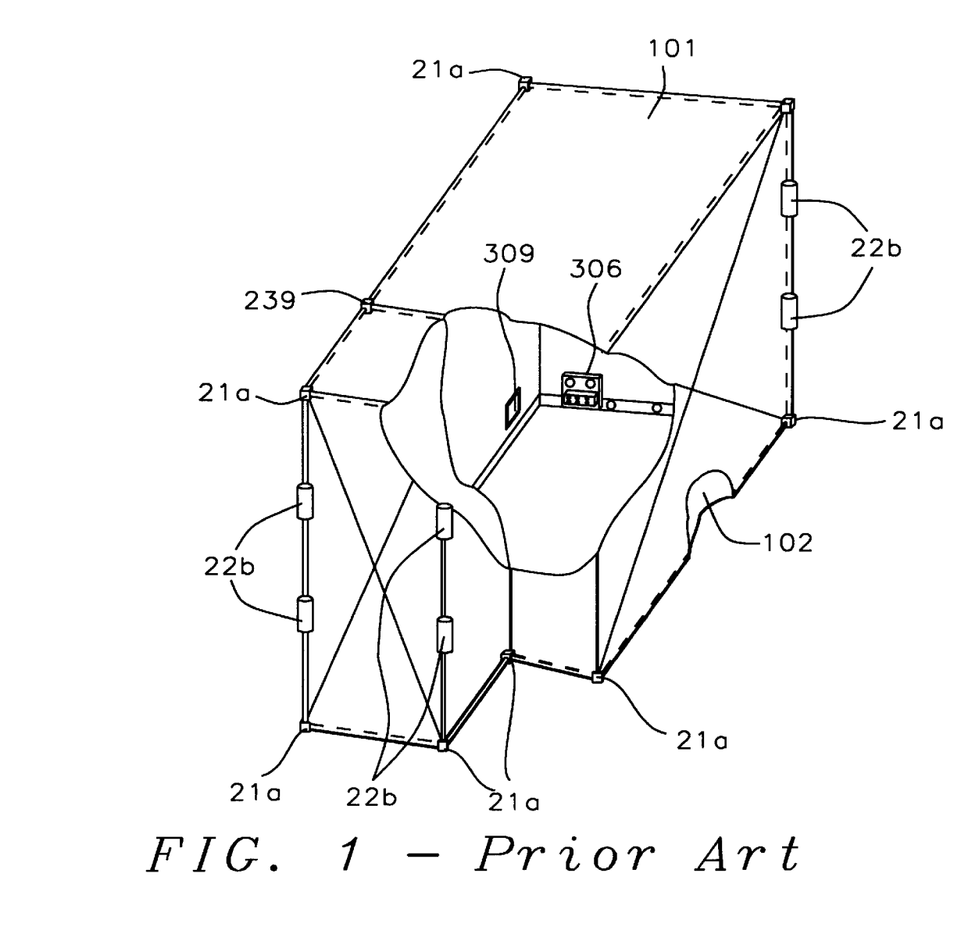
FIG. 1 schematically illustrates a cut-away view of a more conventional enclosure.

FIG. 1 is a schematic drawing of the prior art, showing a conventional, structurally self-contained RF-shielded enclosure which is rapidly deployable due to its light weight and easy assembly. The enclosure can be assembled to create a free-standing room within an existing non-secure room or environment.

FIG. 1 illustrates the conventional construction and its limitations: lightweight metallized fabric 102 is sewn together with rugged tent fabric 101 and ballistics cloth 103. Fiberglass rods 21c, 22a, 23a, 24 are connected to aluminum sleeves and unions 21a, 22b, 23g to configure the room. A bulkhead assembly 306 penetrates the side wall and provides filtered power and electronic signal interfaces. Honeycomb air guides 305 facilitate air exchange within the room.

SUMMARY OF THE INVENTION

The objective of this invention relates directly to the use of shielded rooms or enclosures, shielded specifically against radio frequency interference. EMI/EMC measurement is a specialized area of engineering that requires detailed monitoring of electromagnetic energy emanating from a test object within a controlled environment. Another application is to analyze the behavior of equipment under the influence of high level electromagnetic energy. Performing such measurement in the open is difficult as data is usually masked by high power transmitters. Likewise, equipment tests often require transmission of such high power RF energy that, were tests conducted in the open, they would disrupt civilian and other spectrum users.

This invention offers an alternative means of building a shield facility large enough to accommodate an aircraft but with materials and construction methods that will render the structure low cost, easy to assemble and dissemble, portable, semi-permanent, scaleable and effective.

Although a handful of other devices exist, this invention uses commercial, off-the-shelf materials to reduce costs and development time. The construction techniques integrate several technologies: the construction of an inflatable enclosure; the use of conductive shielding materials; the design of electrical filtering components; and the design of air ventilation filtering components. The enclosure design is modular, permitting large scale (for military applications) or smaller scale (for commercial applications) enclosures to be built with the same materials and methods.

The main object of the invention is to address the need for a low cost, effective, ultra light, portable and rapidly deployable enclosure for temporary, RF-secure electronic testing and operations.

Another object of the invention is to provide electronic design companies with the augmented facility to perform meaningful, pre-compliance, in-house EMI diagnostic testing. The availability of this device ensures that companies will not be constrained by lack of test labs when they are ready to certify their products. Such tests can be carried out whenever the final prototype is ready and can identify most of the prominent EMI problems before the actual process of certifying the product. This device will permit advanced testing of aircraft systems to be carried out in an EMI secured environment and will contribute vastly to the company's ability to bring products to market more quickly and thereby, be more competitive.

Yet another object of this invention is to eliminate the need for specialized personnel and skills to build a shielded device. The device can be assembled with no special training in less than one hour—and can be as easily dissembled.

Yet another object of this invention is to eliminate the need for extensive and permanent storage space. The device is completely deflatable with no rigid components and can de stored easily in limited space until needed.

The invention provides a portable enclosure for electromagnetic compatibility (EMC) testing, comprising a flexible and vacuous arrangement that forms into an inflated arcuate framework having arched ceiling and side supports.

The arcuate framework embodies a plurality of vertical arcuate structural members that are separated from one another and held in place by a multiplicity of vacuous and inflatable horizontal support members attached and pneumatically communicative to the vertical arcuate shaped members. After the flexible and vacuous framework is inflated, the structure is secured to the ground by means of guy-storms that are attached to each side of the plurality of vertical arcuate members. A conductive and flexible main shroud is used to cover the arched ceiling and side support areas defined by the arcuate framework. Separate conductive end capping shrouds cover the front and rear openings of the framework. Both the conductive main shroud and the end capping shrouds are made up of two flexible layers, an inner flexible conductive fabric to provide electrical continuity between the main shroud and enclosure, and an outer flexible fabric layer to provide an all-weather protective shield. A three layered conductive floor shroud is used for covering the floor area under the inflated framework. Conductive zippers and conducive hoop and loop fasteners are affixed to both the inflated framework and layered conductive shrouds, thereby assuring electrical continuity throughout the enclosure.

These and further constructional and operational characteristics of the invention will be more evident from the detailed description given hereafter with reference to the figures of the accompanying drawings which illustrate preferred embodiments and alternatives by way of non-limiting examples.

DETAILED DESCRIPTION OF THE PREFERRED EMBODIMENT

This invention relates to a product development effort that uses off-the-shelf materials to custom-build a low-cost, EMI shielded enclosure.

Figure 2:
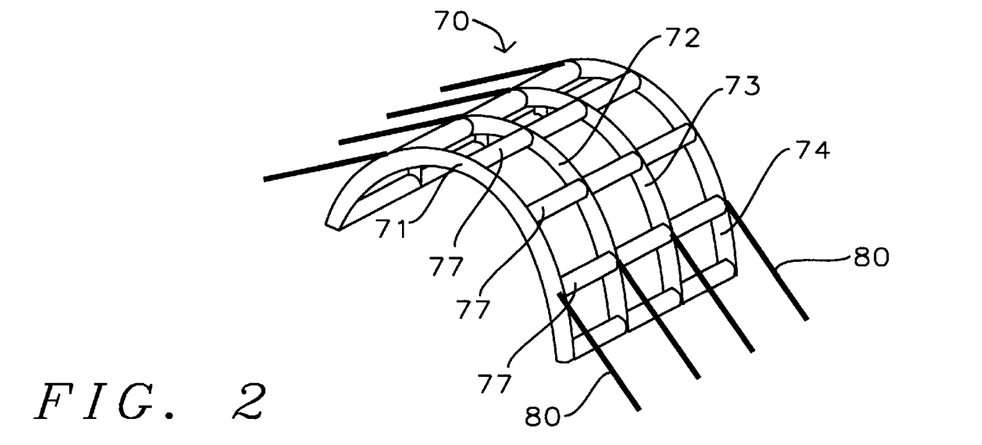
FIG. 2 schematically illustrates an internal/external view of the preferred embodiment's modular, hollow, inflatable, arcuate frame structure and inflatable horizontal members.
Figure 3:
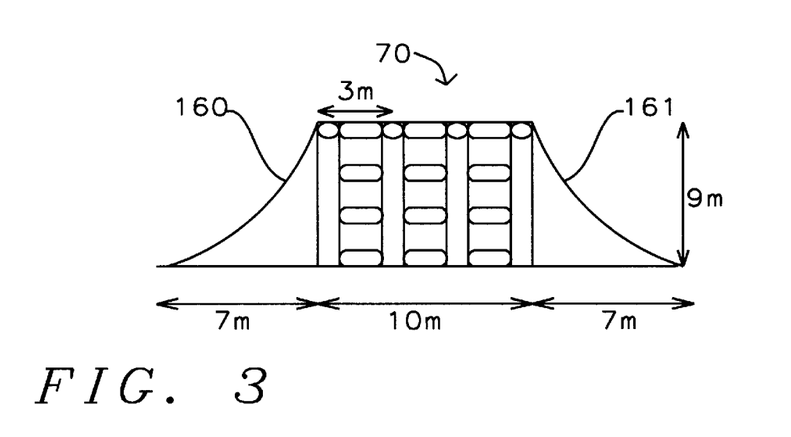
FIG. 3 schematically illustrates a side-view of the preferred embodiment's modular construction and non-rigid framing devices with dimensions.
Figure 4:
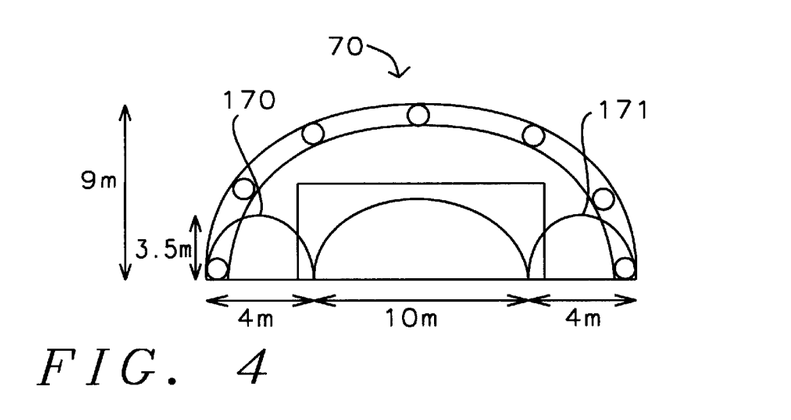
FIG. 4 schematically illustrates an end-view of the preferred embodiment's modular construction and non-rigid framing devices with dimensions.

Refering to FIGS. 2, 3 and 4 showing the inflatable arcuate frame structure and the flexibility of the invention. Each basic module is substantially 10 meters long, 18 meters wide and 9 meters high, allowing similar units to be joined to create a very large enclosure. The framework will be covered by means of shrouds which are electrically contiguous with the main structure. Rather than employ the conventional rigid metal framework, the skeleton for the device takes shape by inflation with a gas using hand-held electric pumps.

The arcuate structure 70 is a hollow, inflatable framework including a plurality of vertical arcuate structural members 71, 72, 73 and 74 which are separated and held in position by a multiplicity of horizontal interposing members 77, each of which is pneumatically communicative between structural members 71, 72, 73 and 74. The structure 70 is secured with multiple guy-storm members 80 tying the arcuate structural members 71, 72, 73 and 74 to stakes in the ground.

FIG. 3 shows the side view of the preferred embodiment and how the structure's front end cap 160 extends out 7 meters and the back end cap 161 extends out the same distance.

FIG. 4 describes the end or front view with internal horizonal and vertical clearances outlined as arc 170 and arc 171.

Figure 5:
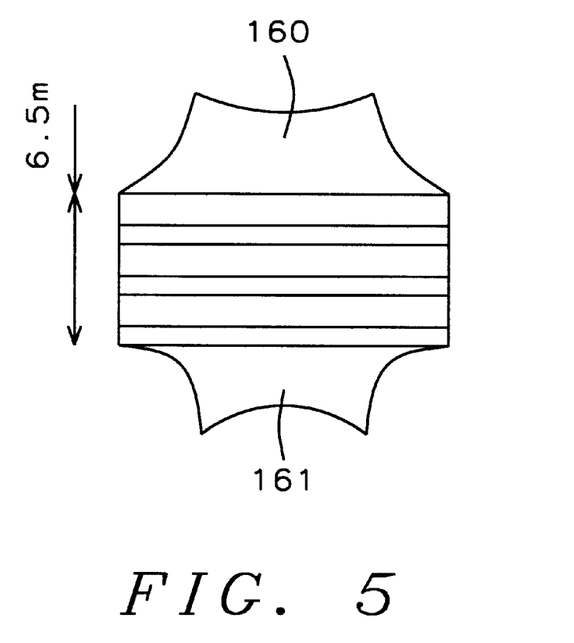
FIG. 5 schematically illustrates the plan view of the enclosure.

FIG. 5 shows the plan view of the preferred embodiment illustrating the end cap shroud 160 and front cap shroud 161 configurations.

Figure 6:
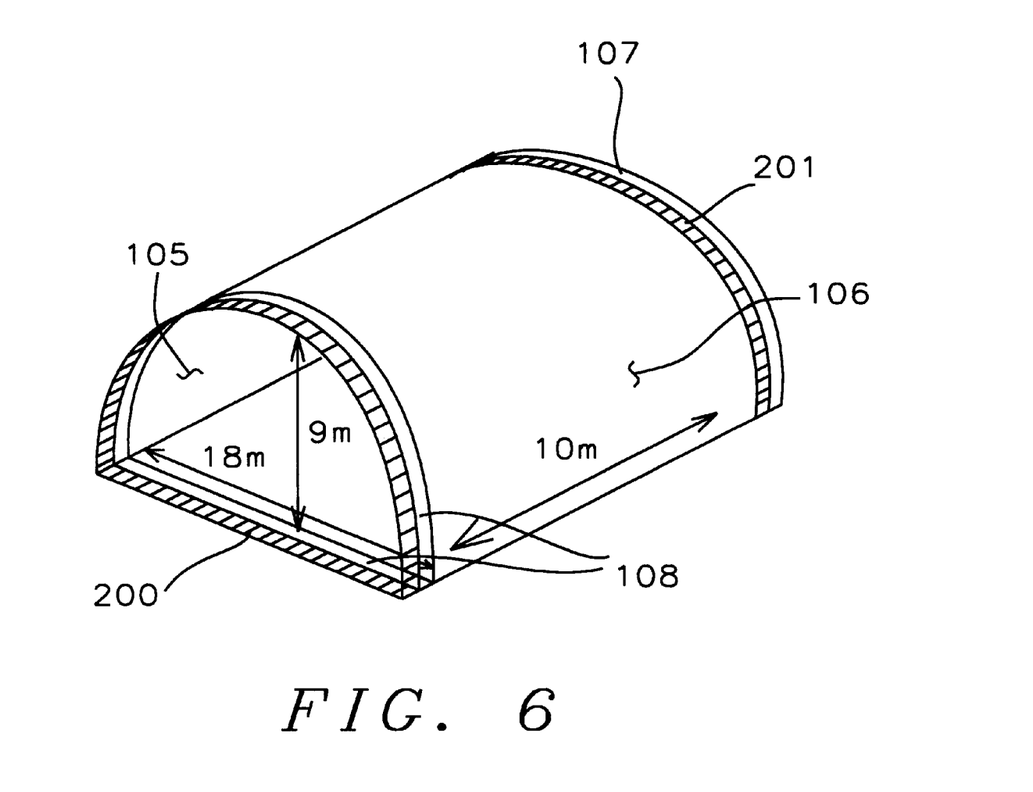
FIG. 6 schematically illustrates the construction of the device describing both the weatherproof and fire retardant materials used to create the enclosure and the apparati used to seal it.

FIG. 6 shows the scale and shape of the two-layered shroud. The inner fabric 105 and outer fabric 106 are connected to each other with a conductive hook and loop arrangement 201 for conductive continuity, illustrated in more detail in FIG. 7. The flap 202 on the inner surface material 105 is closed with a hook portion 107; the exterior material of the shelter 106 is closed via a loop portion 108 of a hook and loop arrangement.

Figure 7:
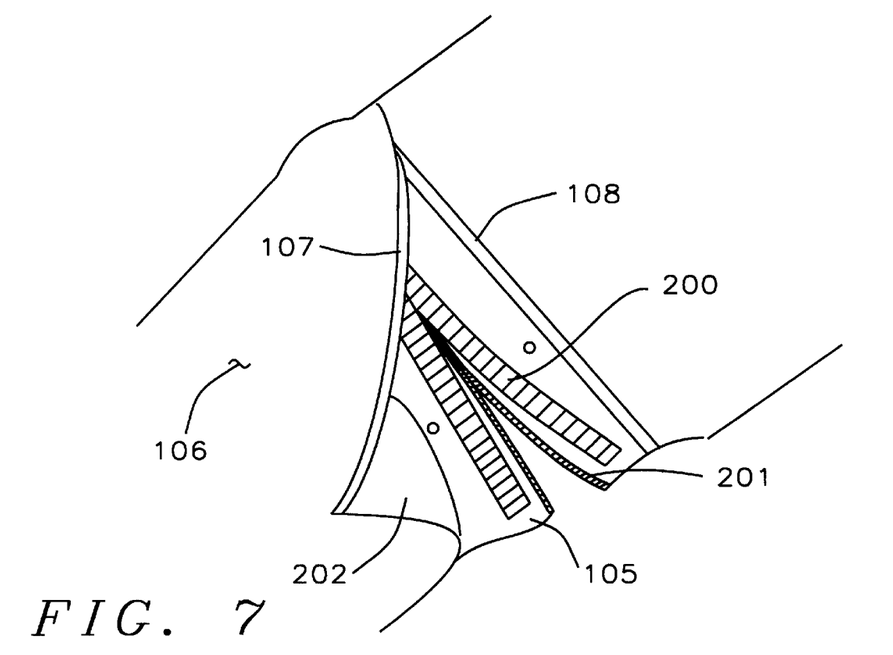
FIG. 7 is a more detailed schematic drawing, a plan view of the closure method used to create the enclosure.

Referring more specifically to FIG. 7, there is shown the method used to connect two modular units easily and effectively. The preferred embodiment requires the use of conductive shielding material 105 as an inner backing for the canvas 106. As the inner conductive shielding material 105 must be electrically continuous throughout the surface, special techniques must be used to ensure that the various openings do not compromise the overall enclosure shielding performance. This is especially critical for connection between modules. Not only must the connection be rigid enough to withstand strong wind conditions, it must also be waterproof and electrically contiguous. When connecting two layered sections together, the inner conductive shielding material 105 is connected to the exterior canvas material 106 with a conductive hook and loop arrangement 201 for conductive continuity; the exterior canvas material 106 is connected to the inner conductive shielding material 105 using a heavy duty zipper 200. A flap 202 is held in place by connecting the hook portion 107 to the loop portion 108 of a hook and loop arrangement.

FIG. 7 also shows the two-layered shroud material. The outer material 106 is a waterproof and flame retardant canvas. The inner conductive fabric 105 is coated with materials consisting of nickel and silver. It has a nominal shielding effectiveness of 75 dB, is lightweight and very resistant to corrosion, offering the advantages of long-time use and portability.

Figure 8A:
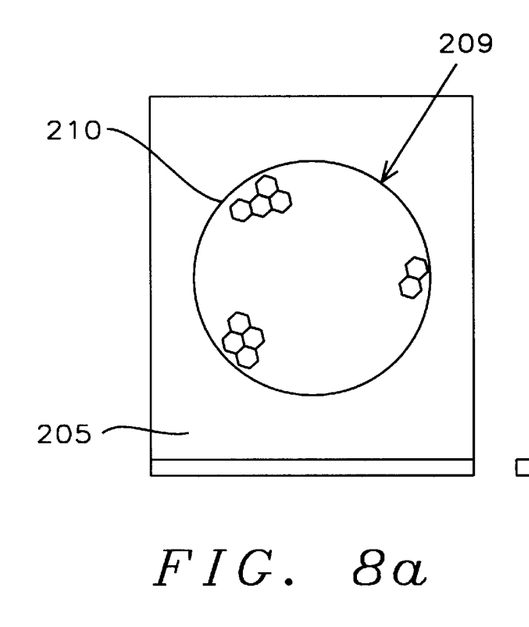
FIGS. 8a and 8b are a front and side view representation of the filter panel and the honeycomb airvent.
Figure 8B:
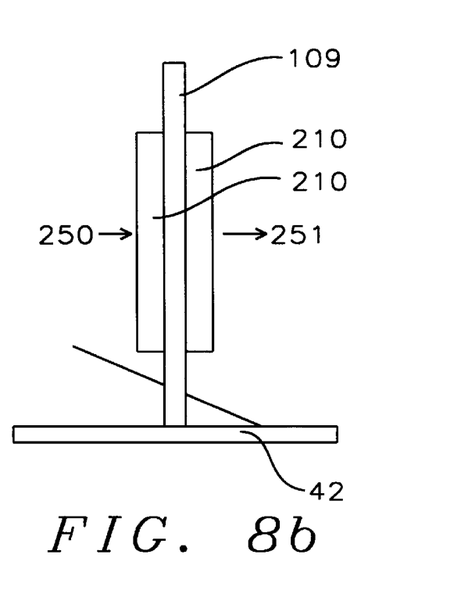

Referring now to FIGS. 8a and 8b, there is shown an air vent structure 205, consisting of an air intake opening 250 and air exhaust opening 251 attached to the enclosure to allow proper ventilation. The structure 205 is a self-supporting metal frame assembly including a vertical member 109 and a base member 42. The vertical member has a circular inlet frame 209 for permitting airflow without compromising the integrity of the enclosure's shielding characteristics. The special air structure 210 consists of honeycomb structures that are one inch thick and are held in place by a circular frame 209. The honeycomb structure consists of tiny, hexagonal cells sandwiched in an orderly fashion to facilitate airflow but reject RF emissions. The size of these cells is carefully selected to provide a high level of attenuation to electromagnetic fields.

Figure 9:
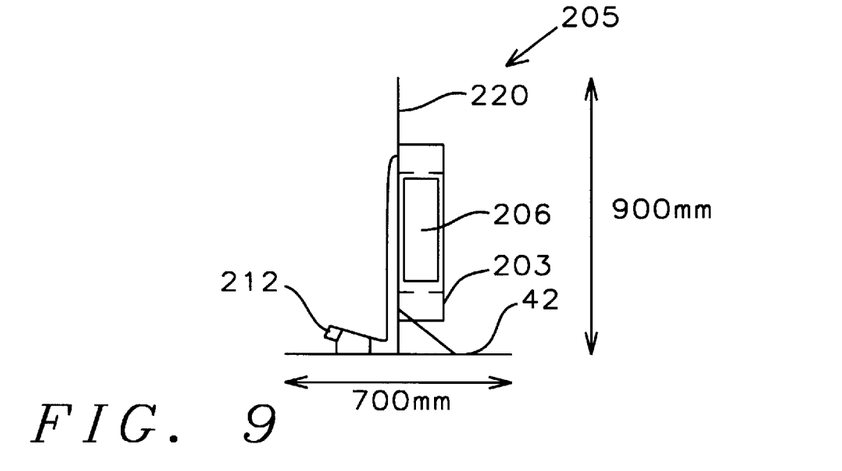
FIG. 9 schematically illustrates a side view representation of the preferred embodiment's filter panel.

Referring now to FIG. 9, the electrical filter panel 205 which shows how the enclosure is fitted to allow power and signal lines to bypass the wall of the enclosure without compromising the shielding performance. Both the power filter 203 and the feedthrough panel 206 are mounted on a self-supporting metal plate assembly 205 having an upright member 220 and a base member 42. It also contains circuit breakers to protect the test object. The electrical filter panel 205 is atttached to the enclosure's flexible frame partition using the inner conductive fabric 105 with a hook and loop arrangement 107, 108.

Figures 10, 11:
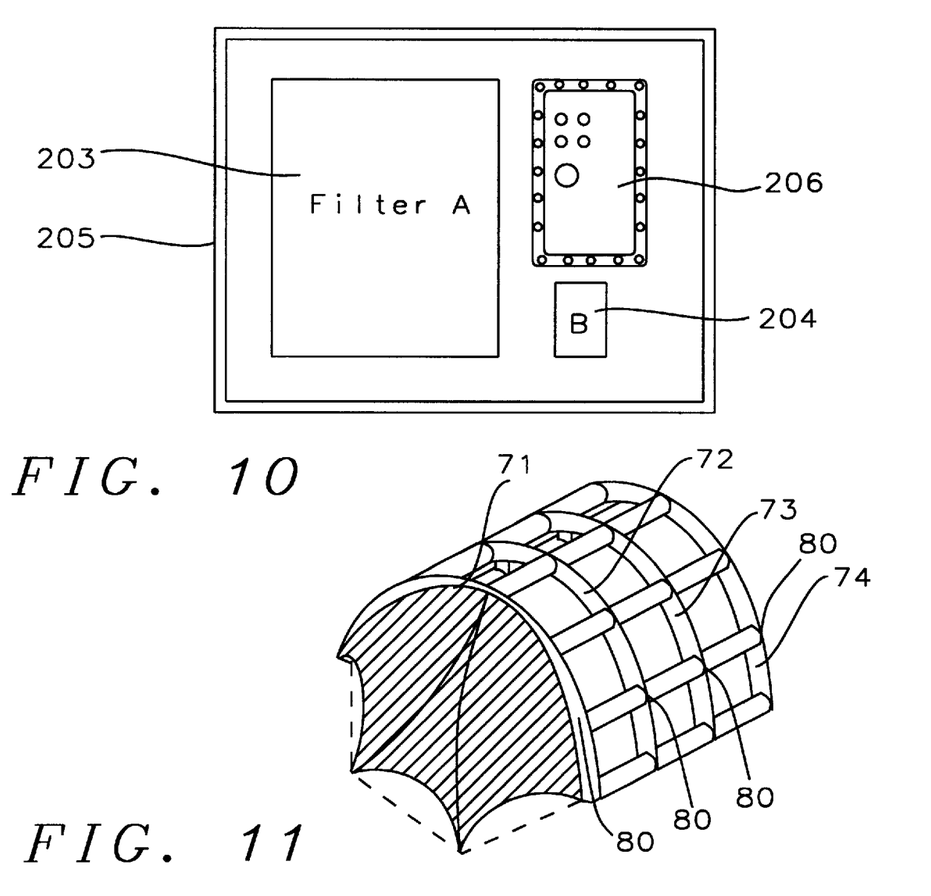
FIG. 10 schematically illustrates a front view of the RF filter panel.
FIG. 11 schematically illustrates the end-cap shroud of the preferred embodiment and the closure method for constructing the device and affixing it to the ground by means of guy-storms attached to a plurality of vertical arcuate structural members.

FIG. 10 is a front view of the same filter panel. The solid, rigid frame structure 205 contains two filter modules 203 and 204, one circuit breaker assembly, one main power socket, two auxilliary power sockets, one main power cord and connector and one auxilliary power cord and connector.

One of the filter modules is a 400 Hz, 115 VAC, 3 (phase+neutral) filter.

Another filter module is a 230 VAC, 50 Hz, single phase filter.

The circuit breaker provides circuit protection for the 115 VAC main power.

The main power socket provides connection to the main power.

The auxilliary sockets provide connection to the 230 VAC electrical power.

FIG. 11 shows the preferred embodiment in 3-dimensional view illustrating how the enclosure is secured to the ground by means of guy-storms 80 that are attached to a plurality of vertical arcuate structural members 71, 72, 73 and 74.

The invention addresses these critical requirements in building temporary test labs for use in specific testing of new aviation or commercial products.

The invention addresses the criteria for a low cost, effective, ultra light, portable and rapidly deployable enclosure for temporary, RF-secure electronic operations. The enclosure addresses the specific testing requirements of new aviation or commercial products but also can meet the temporary needs of an emergency or a short term, non-emergency situation that does not warrant the expense of building and maintaining a permanant structure.

This device will augment existing aircraft/avionics testing capabilities giving manufacturing companies a critical edge in product testing that may help them to get to market faster with better products. Because the device is air-inflatable, it does not require any significant permanent storage space and can be stored uninflated until needed.

The arcuate and inflatable portable structure as defined herein can also be used as a temporary facility for other events requiring transitory housing which provides protection from the elements. Social gatherings, warehousing, and the like, are appropriate uses. The referred to utilization can be done with most standard weatherproof coverings.

While the invention has been particularly shown and described with reference to the preferred embodiments thereof, it will be understood by those skilled in the art that various changes in form and details may be made without departing from the spirit and scope of the invention.

What is claimed is:

1. A portable enclosure for electromagnetic compatibility testing, comprising:

a flexible and vacuous arrangement that forms into an inflated arcuate framework having arched ceiling and side supports, said arcuate framework embodies a plurality of vertical arcuate structural members separated from one another and held in place by a multiplicity of vacuous and inflatable horizontal support members that are attached and pneumatically communicative to said vertical arcuate shaped members;

after said flexible and vacuous structure is inflated, said arcuate framework is secured to the ground by means of guy-storms that are attached to each side of said plurality of vertical arcuate structural members;

a conductive main shroud for covering the arched ceiling and side support areas defined by said inflated arcuate framework, said conductive main shroud includes two flexible layers, a first inner flexible conductive fabric to provide electrical continuity throughout the enclosure, and a second outer flexible fabric layer to provide an all-weather protective shield;

a conductive first and a conductive second end capping shroud for covering, respectfully, front and rear openings of said inflated arcuate framework, said first and second conductive end capping shrouds include two flexible layers, a first inner flexible conductive fabric to provide electrical continuity with the main shroud and enclosure, and a second outer flexible fabric layer to provide an all-weather protective shield;

a three layered conductive floor shroud for covering a floor area defined under said inflated arcuate framework, and conductive zippers and conductive hoop and loop fasteners fixidly attached to both inflated arcuate framework and layered conductive shroud coverings.

2. The portable enclosure of claim 1 wherein said vacuous arrangement is formed into an inflated arcuate framework with a hand-held, battery operated, electric air compressor pump.

3. The portable enclosure of claim 1 wherein connecting said conductive main shroud to said conductive first and second end capping shrouds, and to said three layered floor shroud provides electrical continuity throughout the enclosure, thereupon, producing a radio frequency shield and an all weather shield.

4. The portable enclosure of claim 1 wherein said end capping shrouds include access for large object entry and exit that is provided by means of a hook flap portion to be pulled from a loop flap portion of a hook and loop arrangement sewn vertically along the center of said end capping shroud, thereafter, unzipping a conductive zipper sewn thereunder to open up said entrance means.

5. The portable enclosure of claim 4 wherein said entrance means includes raising unzipped capping shroud by a system of cords and pulleys attached to the top of the enclosure.

6. The portable enclosure of claim 1 wherein said floor shroud includes three layers, an inner layer of rugged ballistic cloth, an intermediate layer of conductive fabric, and an outer layer of all-weather fabric.

7. The portable enclosure of claim 1 wherein said first inner flexible conductive fabric is lightweight, coated with nickel and silver, and laminated with a fire retardant polyvinylchloride.

8. The portable enclosure of claim 1 wherein said second outer shroud material is a polymer coated fabric that is waterproof and fire-retardant.

9. The portable enclosure of claim 1 wherein said inner and outer materials are fastened together forming a conductive shroud giving the combined characteristics of both materials.

10. The portable enclosure of claim 1 wherein said arcuate framework includes conductive seams for connecting said main shroud edges using a french-fold configuration for maintaining electrical continuity.

11. The portable enclosure of claim 1 wherein a flapper structure juts out from both end openings along the front peripheral length of said arcuate framework.

12. The portable enclosure of claim 10 wherein said flapper structure include pouch means disposed along the full length of said flapper, said pouch means removeably contains a stiffening member to further strengthen both ends of said arcuate framework.

13. The portable enclosure of claim 1 wherein said modular framework measures substantially 10 meters long, 18 meters wide and 9 meters high permitting similar units to be joined to create a longer structure of up to three units and a maximum of about 30 meters long.

14. The portable enclosure of claim 12 wherein a shroud for covering up three units is accomplished by connecting standard lengths of shrouds made up for single units using a combination of conductive zippers and hooks and loops disposed at alternate ends of each standard length shroud.

15. The portable enclosure of claim 1, further comprising:
an air intake panel;
an air exhaust panel;
an RF filter panel.

16. The portable enclosure of claim 1 wherein said main shroud includes an air intake opening, air exhaust opening, and a filter panel opening.

17. The portable enclosure of claim 16 wherein said air intake opening, air exhaust opening, and filter panel opening includes a conductive zipper and a conductive hook and loop configuration disposed along the edge of each opening in the main shroud.

18. The portable enclosure of claim 16 wherein said air intake opening, air exhaust opening and filter panel opening are provided with a flexible panel that is hingeably attached along an upper edge, of each opening, for cover when not in use.

19. The portable enclosure of claim 15 wherein an air intake panel, air exhaust panel, and filter panel are contained within separate rigid metallic frame structures having an inner pattern of parallel strips of a conductive hook portion of a hook and loop arrangement, and, an outer pattern of a conductive zipper, whereby each of said inner and outer pattern is affixed concentrically at the periphery of each panel, said panels are assembled to appropriate openings to said main shroud.

20. The portable enclosure of claim 19 wherein said air-intake and air-exhaust panels include a circular honeycomb structure attached to said rigid metallic frame structure which provides support for attaching to the main shroud, said air-intake opening is connected to an electric blower means positioned externally via a flexible ducting for providing air exchanges for the enclosure.

21. The portable enclosure of claim 15 wherein said RF filter panel includes two filter modules, one circuit breaker assembly, one main power socket, two auxiliary power sockets, one main power cord with connector, and one auxiliary power cord with connector.

22. The portable enclosure of claim 21 wherein one of said filter module is a 400 Hz, 115 VAC, 3 phase+neutral filter, the other filter module is a 50 Hz, 230 VAC, single phase filter.

23. The portable enclosure of claim 21 wherein said circuit breaker provides circuit rotation for the 115 VAC main power.

24. The portable enclosure of claim 21 wherein said power socket provides connection to the main power.

25. The portable enclosure of claim 21 wherein said auxiliary sockets provides connection to the 230 VAC electrical power.

26. A method for constructing a portable facility for electromagnetic compatibility testing, comprising the steps of:

providing a flexible and vacuous structure that forms into an inflated arcuate framework having arched ceiling supports and side legs, said arcuate framework embodies a plurality of vertical arcuate structural members separated from one another and held in place by a multiplicity of vacuous horizontal support members that are attached and pneumatically communicative with said vertical arcuate shaped members;

after said flexible and vacuous structure is inflated, said arcuate framework is secured to the ground by means of guy-storms that are attached to the side legs of said plurality of vertical arcuate structural members;

providing a conductive main shroud for covering the arched ceiling and side support areas defined by said inflated arcuate framework, said conductive main shroud includes two flexible layers, a first inner flexible conductive fabric to provide electrical continuity throughout the enclosure, and a second outer flexible fabric layer to provide an all-weather protective shield;

providing a conductive first and a conductive second end capping shroud for covering, respectfully, front and rear openings of said inflated arcuate framework, said first and second conductive end capping shrouds include two flexible layers, a first inner flexible conductive fabric to provide electrical continuity with the main shroud and enclosure, and a second outer flexible fabric layer to provide an all-weather protective shield;

providing a three layered conductive floor shroud for covering a floor area defined under said inflated arcuate framework, and providing conductive zippers and conductive hoop and loop fasteners fixidly attached to both inflated arcuate framework and layered conductive shroud coverings.

27. The method of claim 26 wherein said vacuous arrangement is formed into an inflated arcuate framework with a hand-held, battery operated, electric air compressor pump.

28. The method of claim 26 wherein connecting said conductive main shroud to said conductive first and second end capping shrouds, and to said three layered floor shroud provides electrical continuity throughout the enclosure, thereupon, producing a radio frequency shield and an all weather shield.

29. The method of claim 26 wherein said end capping shrouds include access for large object entry and exit that is provided by means of a hook flap portion to be pulled from a loop flap portion of a hook and loop arrangement sewn vertically along the center of said end capping shroud, thereafter, unzipping a conductive zipper sewn thereunder to open up said entrance means.

30. The method of claim 26 wherein said entrance means includes raising unzipped capping shroud by a system of cords and pulleys attached to the top of the enclosure.

31. The method of claim 26 wherein said floor shroud includes three layers, an inner layer of rugged ballistic cloth, an intermediate layer of conductive fabric, and an outer layer of all-weather fabric.

32. The method of claim 26 wherein said first inner flexible conductive fabric is lightweight, coated with nickel and silver, and laminated with a fire retardant polyvinylchloride.

33. The method of claim 28 wherein said second outer shroud material is a polymer coated fabric that is waterproof and fire-retardant.

34. The method of claim 26 wherein said inner and outer materials are fastened together forming a conductive shroud giving the combined characteristics of both materials.

35. The method of claim 26 wherein said arcuate framework includes seams for connecting said main shroud edges using a french-fold configuration for maintaining electrical continuity.

36. The method of claim 26 wherein a flapper structure juts out from both end openings along the front peripheral length of said arcuate framework.

37. The method of claim 36 wherein said flapper structure include pouch means disposed along the full length of said flapper, said pouch means removeably contains a stiffening member to further strengthen both ends of said arcuate framework.

38. The method of claim 26 wherein said modular framework measures substantially 10 meters long, 18 meters wide and 9 meters high permitting similar units to be joined to create a longer structure of up to three units and a maximum of about 30 meters long.

39. The method of claim 38 wherein a shroud for covering up three units is accomplished by connecting standard lengths of shrouds made up for single units using a combination of conductive zippers and hooks and loops disposed at alternate ends of each standard length shroud.

40. The method of claim 26, further comprising:

providing an air intake panel;

providing an air exhaust panel;

providing an RF filter panel.

41. The method of claim 26 wherein said main shroud includes an air intake opening, air exhaust opening, and a filter panel opening.

42. The method of claim 41 wherein said air intake opening, air exhaust opening, and filter panel opening includes a conductive zipper and a conductive hook and loop configuration disposed along the edge of each opening in the main shroud.

43. The method of claim 41 wherein said air intake opening, air exhaust opening and filter panel opening are provided with a flexible panel that is hingeably attached along an upper edge, of each opening, for cover when not in use.

44. The method of claim 40 wherein an air intake panel, air exhaust panel, and filter panel are contained within separate rigid metallic frame structures having an inner pattern of parallel strips of a conductive hook portion of a hook and loop arrangement, and, an outer pattern of a conductive zipper, whereby each of said inner and outer pattern is affixed concentrically at the periphery of each panel, said panels are assembled to appropriate openings to said main shroud.

45. The method of claim 40 wherein said air-intake and air-exhaust panels include a circular honeycomb structure attached to said rigid metallic frame structure which provides support for attaching to the main shroud, said air-intake opening is connected to an electric blower means positioned externally via a flexible ducting for providing air exchanges for the enclosure.

46. The method of claim 40 wherein said RF filter panel includes two filter modules, one circuit breaker assembly, one main power socket, two auxiliary power sockets, one main power cord with connector, and one auxiliary power cord with connector.

47. The method of claim 46 wherein one of said filter module is a 400 Hz, 115 VAC, 3 phase+neutral filter, the other filter module is a 50 Hz, 230 VAC, single phase filter.

48. The method of claim 46 wherein said circuit breaker provides circuit protection for the 115 VAC main power.

49. The method of claim 46 wherein said power socket provides connection to the main power.

50. The method of claim 46 wherein said auxiliary sockets provide connection to the 230 VAC electrical power.

* * * * *